(12) United States Patent
Yau et al.

(10) Patent No.: US 12,310,048 B2
(45) Date of Patent: May 20, 2025

(54) SILICON-CARBIDE (SiC) METAL-OXIDE-SEMICONDUCTOR FIELD-EFFECT TRANSISTOR (MOSFET) WITH SHORT CIRCUIT PROTECTION

(71) Applicant: Hong Kong Applied Science and Technology Research Institute Company Limited, Hong Kong (HK)

(72) Inventors: Shu Kin Yau, Hong Kong (HK); Chenyue Ma, Hong Kong (HK); Siu Wai Wong, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 658 days.

(21) Appl. No.: 17/716,178

(22) Filed: Apr. 8, 2022

(65) Prior Publication Data
US 2023/0327018 A1    Oct. 12, 2023

(51) Int. Cl.
*H10D 30/60*    (2025.01)
*H10D 62/17*    (2025.01)
*H10D 62/832*   (2025.01)

(52) U.S. Cl.
CPC ......... *H10D 30/615* (2025.01); *H10D 62/299* (2025.01); *H10D 62/393* (2025.01); *H10D 62/8325* (2025.01)

(58) Field of Classification Search
CPC ............. H10D 62/8325; H10D 30/615; H10D 30/668; H10D 62/107; H10D 62/127;
(Continued)

(56) References Cited

U.S. PATENT DOCUMENTS 5,422,288 A    6/1995  Neilson et al.
6,465,304 B1 * 10/2002  Blanchard ............ H10D 62/107
                                                257/E21.418
(Continued)

FOREIGN PATENT DOCUMENTS

CN    102420251 A    4/2012
CN    108511527 A    9/2018
(Continued)

*Primary Examiner* — Mark W Tornow
*Assistant Examiner* — Priya M Rampersaud
(74) *Attorney, Agent, or Firm* — Stuart T. Auvinen; gPatent LLC

(57) ABSTRACT

An integrated MOSFET-JFET device made from a Silicon-Carbide (SiC) wafer has N+ source, P body diode, and upper N regions that form vertical MOSFETs on the sidewalls of polysilicon gates. An N substrate under the upper N region forms a drift region that is pinched by the JFET to limit saturation current. Trenches are formed between MOSFETs. JFETs are formed by doping the bottom and sidewalls of the trenches to form P+ taps to the N substrate. P islands within the N substrate are formed underneath the P+ taps. These P islands are wider near the surface but are successively narrower with increased vertical spacing deeper into the N substrate. This P-island tapering provides a tapered shape to the JFET depletion region that pinches the MOSFET drift region in the N substrate to limit saturation current and yet reduce linear-region ON resistance.

15 Claims, 13 Drawing Sheets

(58) Field of Classification Search
CPC .. H10D 62/157; H10D 62/299; H10D 62/393; H10D 64/256; H10D 62/106; H10D 30/0297; H10D 62/111; H10D 62/105; H10D 12/481; H10D 30/0295; H10D 62/112; H10D 64/513; H10D 8/60; H10D 84/144; H10D 12/038; H10D 30/0289; H10D 89/811; H10D 84/146; H10D 62/153; H10D 30/65; H10D 62/102; H10D 62/104; H10D 84/035; H01L 2924/10272; H01L 2924/13091; H10B 63/34

See application file for complete search history.

(56) References Cited

U.S. PATENT DOCUMENTS

| | | | |
|---|---|---|---|
| 9,252,280 | B2 | 2/2016 | Zhu et al. |
| 9,595,519 | B2 | 3/2017 | Titus et al. |
| 9,947,779 | B2 | 4/2018 | Zeng et al. |
| 10,504,995 | B1 | 12/2019 | Domeij |
| 2008/0197361 | A1* | 8/2008 | Ueno ................ H10D 12/031 257/77 |
| 2008/0277695 | A1 | 11/2008 | Li et al. |
| 2009/0146209 | A1* | 6/2009 | Akiyama .......... H10D 30/0295 257/334 |
| 2012/0080748 | A1* | 4/2012 | Hsieh ................ H10D 30/668 257/E21.409 |
| 2012/0175699 | A1 | 7/2012 | Hsieh |
| 2014/0353747 | A1* | 12/2014 | Cheng ................ H10D 64/516 257/334 |
| 2016/0104702 | A1* | 4/2016 | Hsieh ................ H10D 64/661 257/334 |
| 2018/0261666 | A1* | 9/2018 | Zeng .................. H10D 64/518 |
| 2019/0109228 | A1* | 4/2019 | Kobayashi .......... H10D 62/107 |

FOREIGN PATENT DOCUMENTS

| | | |
|---|---|---|
| CN | 212517211 U | 2/2021 |
| DE | 102016205331 A1 | 10/2017 |

* cited by examiner

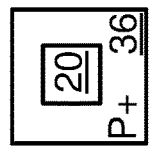 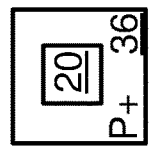 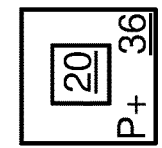
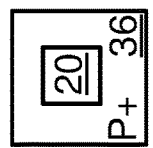 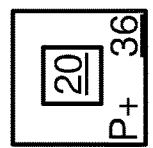 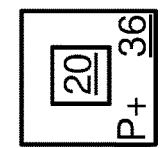
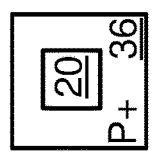 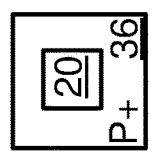 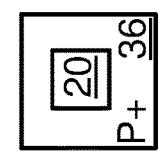
FIG. 13

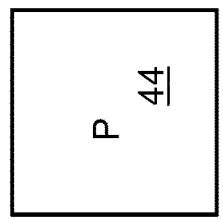 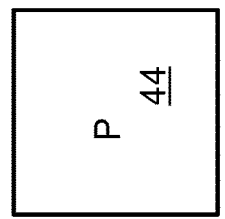 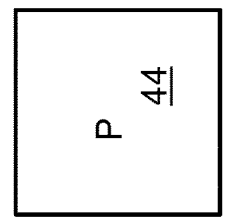
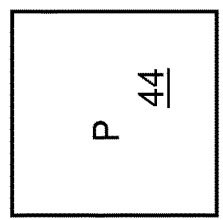 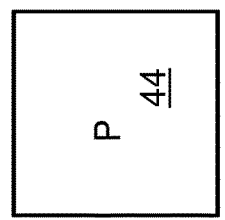 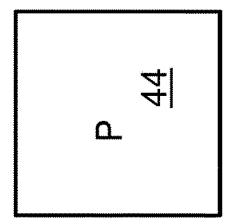
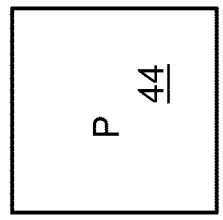 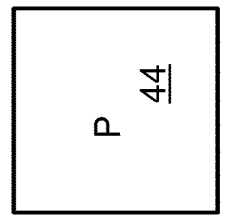 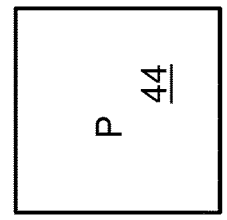
FIG. 14

US 12,310,048 B2

SILICON-CARBIDE (SiC) METAL-OXIDE-SEMICONDUCTOR FIELD-EFFECT TRANSISTOR (MOSFET) WITH SHORT CIRCUIT PROTECTION

FIELD OF THE INVENTION

This invention relates to short-circuit protection circuits, and more particularly to protection devices for high-voltage transistors.

BACKGROUND OF THE INVENTION

Power electronics must supply high currents at high voltages. Standard Silicon Metal-Oxide-Semiconductor (MOS) process transistors cannot handle such high voltages and currents, so Silicon Carbide (SiC) substrates may be used rather than Silicon substrates. Integrated circuits (IC's) are prone to damage caused by short circuits where loads are suddenly reduced causing damaging over-currents.

FIG. 1 shows a current-voltage curve for a prior-art SiC MOS transistor. SiC and Si Metal-Oxide-Semiconductor Field-Effect Transistors (MOSFET) have similar I-V curves, but SiC transistors can carry much higher currents and operate at higher voltages. For efficiency and to prevent overheating, the drain-to-source ON resistance, $R_{DSON}$, needs to be low when high currents are used. $R_{DSON}$ is the slope of curve 102 at lower voltages, in the linear region of transistor operation. At higher drain voltages, the transistor enters the saturation region of operation, where the drain current $I_D$ is less dependent on the drain voltage $V_{DS}$. This saturation current IDSAT cannot be too high or damage may occur when a short circuit causes the saturation current to flow.

Thus it is desirable to have a lower ON resistance, $R_{DSON}$, and a lower saturation current, $I_{DSAT}$, for a more efficient SiC device with good short-circuit protection.

In addition to MOSFET devices, Junction Field-Effect Transistors (JFET) devices may also be formed by a SiC manufacturing process. JFET devices do not have an oxide gate, but rather have a pn junction depletion region that expands to pinch a conducting channel and thus regulate current. JFET devices tend to have lower ON resistance, $R_{DSON}$, and a lower saturation current, $I_{DSAT}$, than do MOSFET devices. However, JFET devices are normally ON, while MOSFET devices are normally OFF. This normally-ON characteristic of JFET devices makes circuit design difficult despite the better I-V characteristics.

FIG. 2 shows a prior-art SiC cascode JFET co-package device. A Silicon MOSFET and a Silicon-Carbide JFET are packaged together as a commercial product. Bonding wires connect the silicon die with the SiC die within the co-package.

Si MOSFET 304 has its drain connected to the source of SiC JFET 306. When the gate G of Si MOSFET 304 is driven low, Si MOSFET 304 stops conducting current, stopping current flow from normally-ON SiC JFET 306 between package terminals D and S.

FIG. 3 shows I-V characteristics of the prior-art SiC cascode JFET co-package device of FIG. 2. Curve 108 is for the cascode co-package device of FIG. 2, while curve 104 is for a standard SiC MOSFET. Curve 108 has a higher initial lope in the linear region, which means that it has a higher $R_{DSON}$, but has a lower saturation current $I_{DSAT}$ than the conventional MOSFET. Thus the cascode JFET-MOSFET device achieves better short-circuit performance than a single MOSFET, while being able to be shut off with a lower short circuit energy dissipation.

While useful, the co-package device is large and expensive. An integrated device with both a JFET and a MOSFET is desired. An integrated device having both MOSFET and JFET devices formed from SiC is desirable. A SiC MOSFET device with good short-circuit protection and low ON resistance is desirable. A SiC MOSFET-JFET device with integrated features to shape its I-V curve for better linear-region efficiency and better short-circuit protection is desirable.

BRIEF DESCRIPTION OF THE DRAWINGS

FIG. 13 is a horizontal section through the JFET.

FIG. 14 is a horizontal section through the P islands.

DETAILED DESCRIPTION

The present invention relates to an improvement in high-voltage devices. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
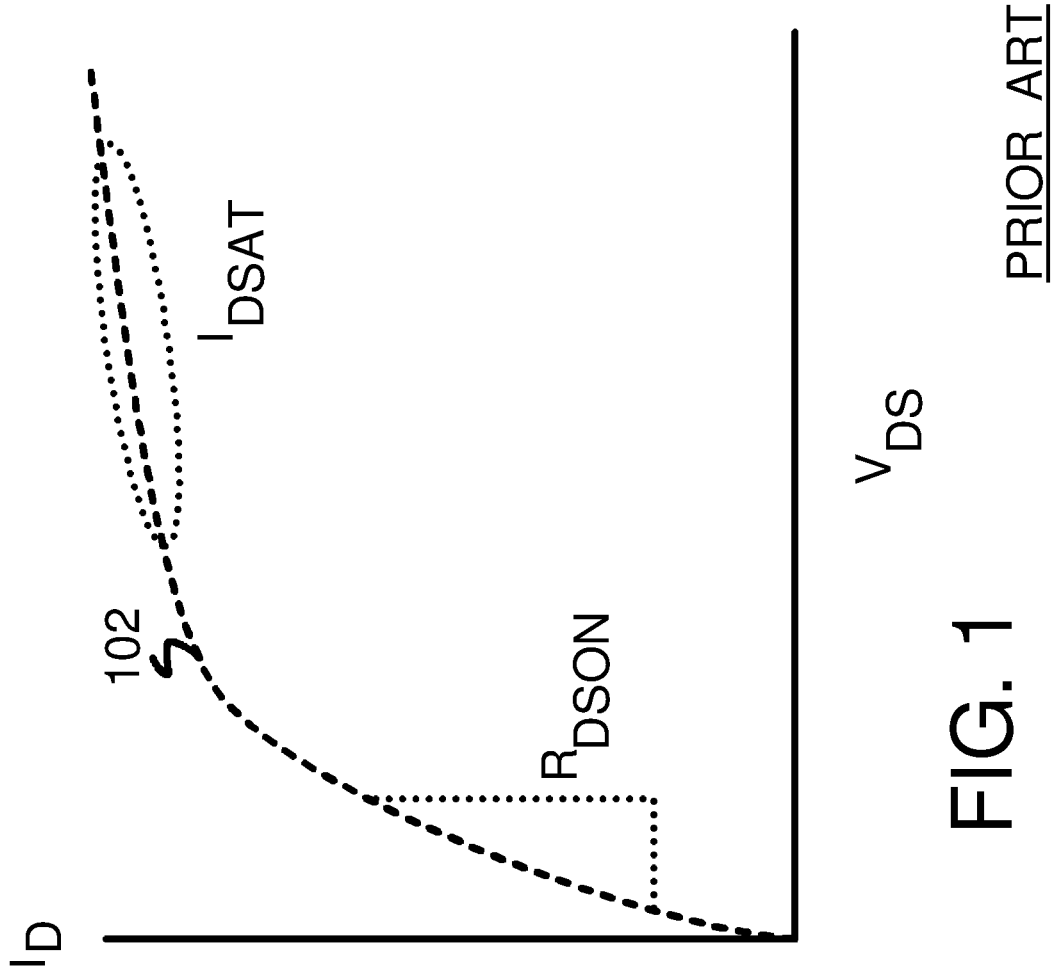
FIG. 1 shows a current-voltage curve for a prior-art SiC MOS transistor.
Figure 3:
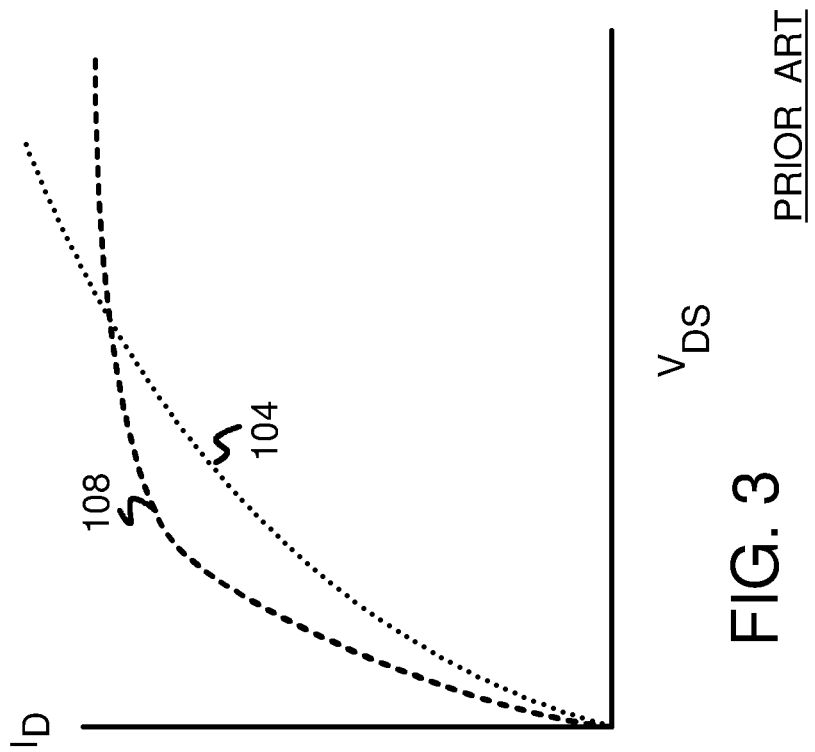
FIG. 3 shows I-V characteristics of the prior-art SiC cascode JFET co-package device of FIG. 2.
Figure 2:
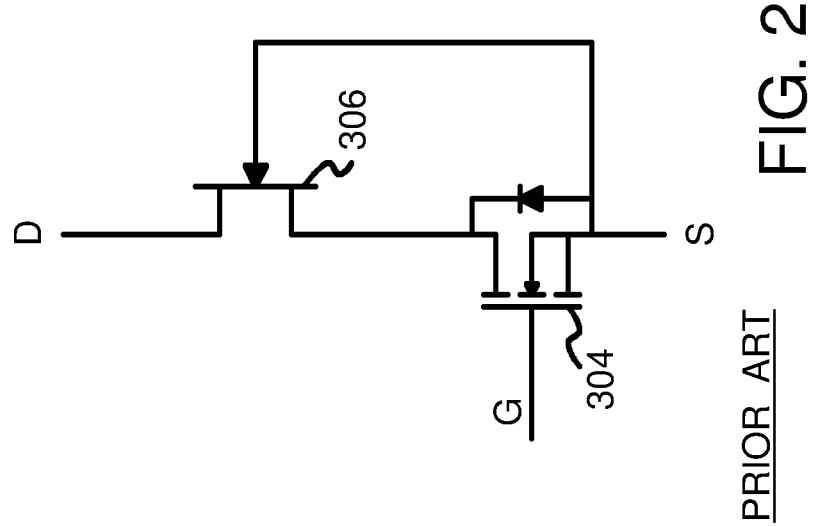
FIG. 2 shows a prior-art SiC cascode JFET co-package device.
Figure 4:
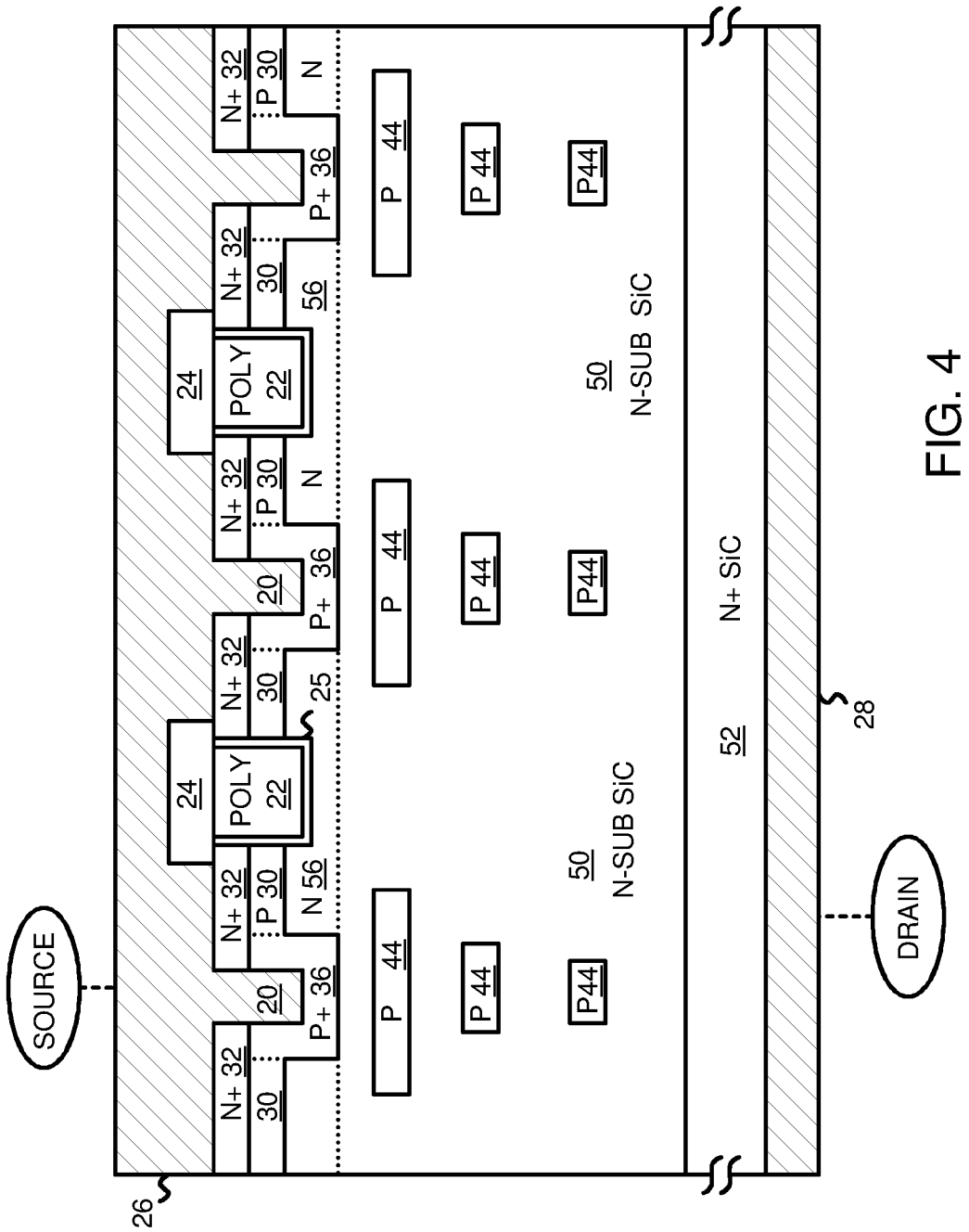
FIG. 4 is a cross-section of an integrated MOSFET-JFET device with ON-resistance trimming p-islands.

FIG. 4 is a cross-section of an integrated MOSFET-JFET device with ON-resistance trimming p-islands. A vertical MOSFET is formed by N+ source 32, P region 30, upper N region 56, and polysilicon gate 22. A JFET is formed by P+ tap 36 and N substrate 50. P islands 44 act as a JFET extension structure that shape the I-V curve.

A highly-doped N+ SiC wafer substrate forms N+ drain 52, with drain metal 28 formed on the backside. N+ drain 52 is very thick, such as 150-350 µm, and supports the other thin layers (less than 20 µm) as the mechanical substrate or wafer. Lightly-doped N substrate 50 is grown as one or more epitaxial layers on N+ drain 52, along with P islands 44.

P islands 44 are centered over trench 20. P islands 44 that are deeper within N substrate 50 have a narrower width than the wider P islands 44 closer to the top surface. Also, the vertical spacing between P islands 44 increases for deeper P islands 44. As shown later in FIG. 10, this tapering of width and spacing of P islands 44 provides a lower ON resistance, $R_{DSON}$, for the linear region with lower drain-source voltages while lowering saturation current $I_{DSAT}$ for higher drain-source voltages in the saturation region. Thus P islands 44 better shape or trim the I-V curve.

P region 30 is connected to source metal 26 through P+ tap 36, while N+ source 32 is also contacted by source metal 26. All of N+ source 32, P+ tap 36, P region 30, N substrate 50, P islands 44, upper N region 56, and N+ drain 52 are Silicon-Carbide (SiC).

Upper N region 56 is formed over the top of N substrate 50, such as by epitaxial growth. Upper N region 56 has a slightly higher doping than N substrate 50, and provides better mobility.

Epitaxial growth or implantation may be used to form P region 30 over upper N region 56, and to form N+ source 32 over upper N region 56. A vertical N-P-N structure of the vertical MOSFET is created by N+ source 32, P region 30, upper N region 56.

P region 30 forms the MOS channel that is controlled by polysilicon gate 22. N+ source 32 is the source, connected to source metal 26, and upper N region 56 is the drain, connected to drain metal 28 through N substrate 50 and N+ drain 52.

Gate oxide 25 is grown over P region 30, N+ source 32, and upper N region 56 on three sides of poly silicon gate 22, which can be formed in a trench cut into N+ source 32, P region 30, and upper N region 56. Gate oxide 25 separates P region 30, N+ source 32, and upper N region 56 from polysilicon gate 22. Insulator 24 isolates source metal 26 from polysilicon gate 22.

Trench 20 is formed in N substrate 50. Trench 20 is centered over P islands 44 but does not contact P islands 44. P+ tap 36 is formed on the bottom and sidewalls of trench 20, such as by ion implantation. P+ tap 36 has a higher doping than P region 30, and blends into P region 30 underneath N+ source 32. Source metal 26 is deposited on the walls of trench 20 and over N+ source 32. Source metal 26 forms an ohmic or a Schottky contact with P+ tap 36 and with N+ source 32.

P+ tap 36 and N substrate 50 form the JFET device. As the drain-to-source voltage increases, the depletion region under P+ tap 36 increases and touches the uppermost of P islands 44, extending the depletion region by the shape of the uppermost P islands 44. This uppermost of P islands 44 extends past the corners of trench 20 to shield the JFET of P+ tap 36 in trench 20 and prevent current crowding at the JFET channel.

Lower P islands 44 are reached by the expanding depletion region for higher drain-source voltages. These lower P islands 44 are successively narrower, providing a successively wider current path through N substrate 50. This wider current path results in a lower ON resistance in the linear region and a lower Idsat in the saturation region.

Figure 5B:
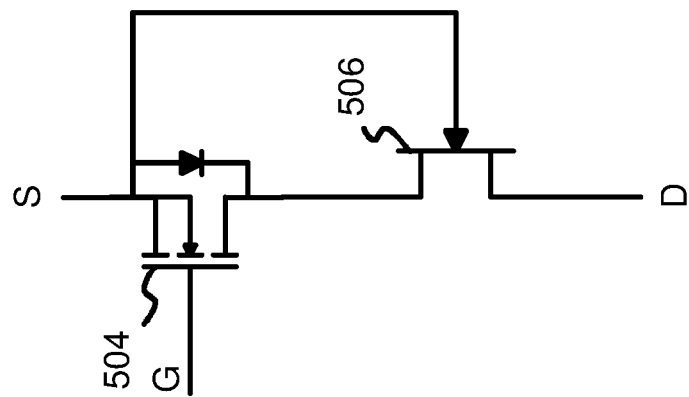
FIG. 5A-5B are electrical diagrams of the integrated MOSFET-JFET device with ON-resistance trimming p-islands of FIG. 4.
Figure 5A:
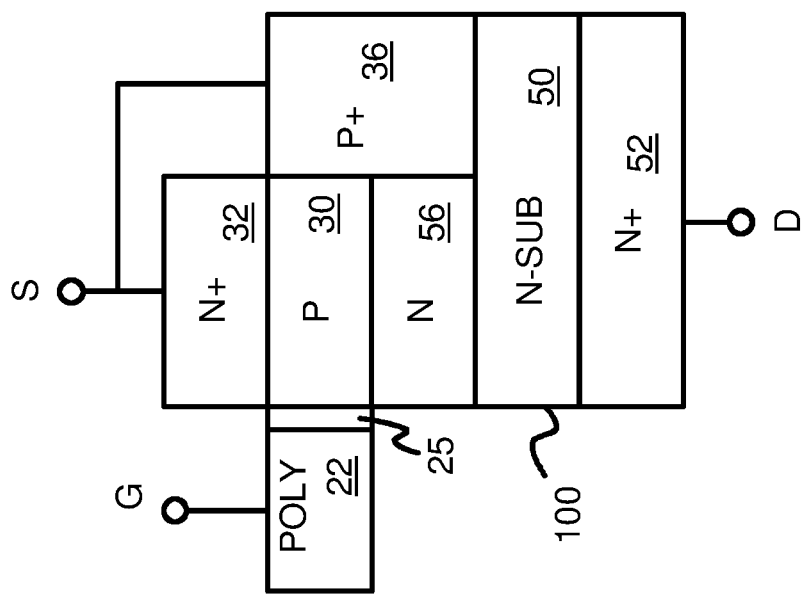

FIG. 5A-5B are electrical diagrams of the integrated MOSFET-JFET device with ON-resistance trimming p-islands of FIG. 4.

In FIG. 5A, integrated MOSFET-JFET device 100 has a SiC MOSFET formed by N+ source 32, P region 30, and upper N region 56 as the drain, with gate terminal G controlling polysilicon gate 22 that is separated by gate oxide 25. The MOSFET drain, upper N region 56, connects to drain terminal D through N substrate 50 and N+ drain 52.

Integrated MOSFET-JFET device 100 also has a SiC JFET formed by P+ tap 36 that is connected to the source S terminal, and N substrate 50 that connects to the drain D terminal through N+ drain 52.

In FIG. 5B, integrated MOSFET-JFET device 100 has SiC MOSFET 504 and SiC JFET 506 connected in series between terminals S, D. Source terminal S connects to the source of SiC MOSFET 504 and to the junction gate terminal of SiC JFET 506. When gate G to SiC MOSFET 504 is low, current does not flow through SiC MOSFET 504 to SiC JFET 506, shutting off current flow between terminals S, D. SiC MOSFET 504 is a n-channel transistor (NMOS device).

Figure 6:
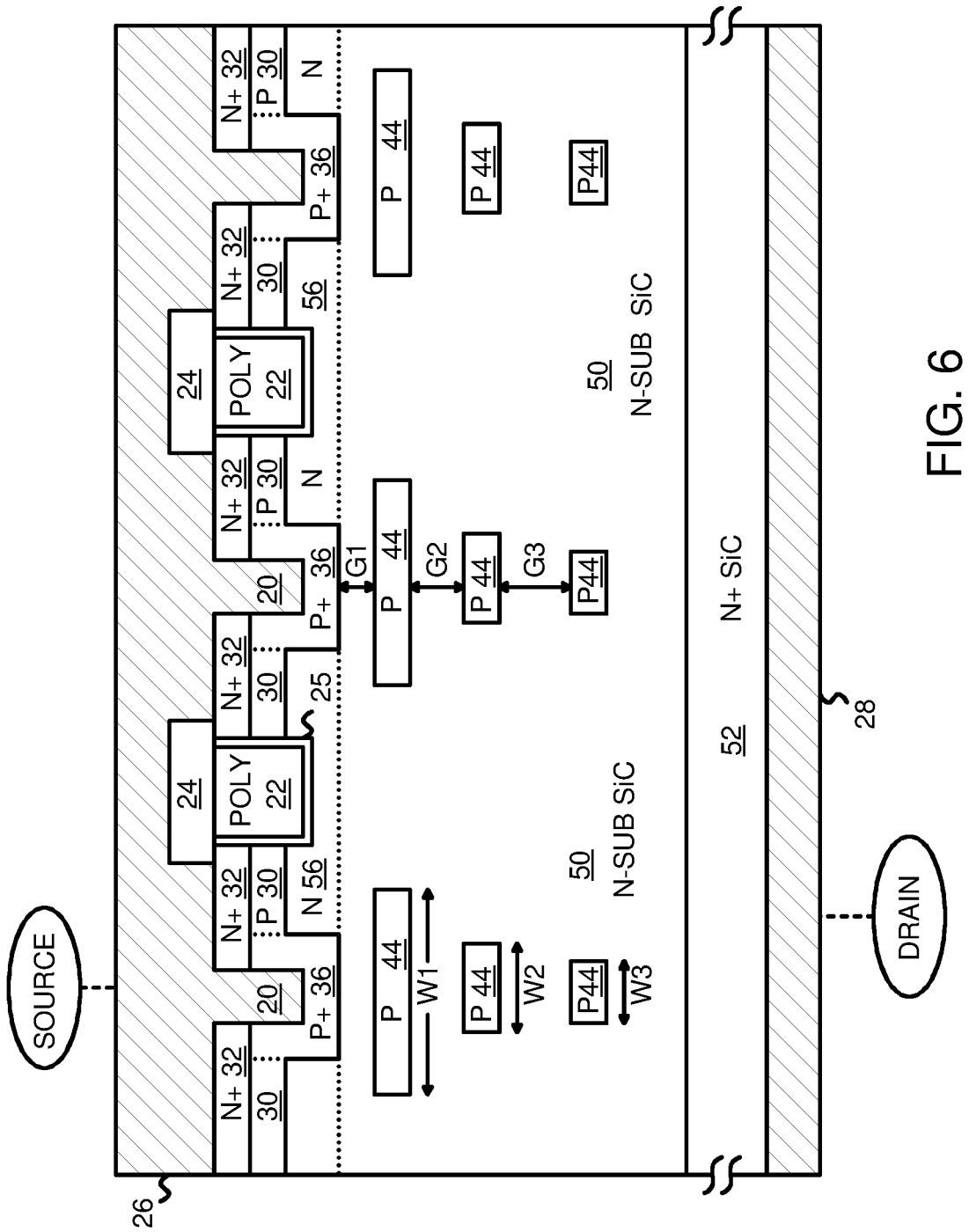
FIG. 6 highlights tapering of the P islands in the integrated MOSFET-JFET device.

FIG. 6 highlights tapering of the P islands in the integrated MOSFET-JFET device. P islands 44 under each trench 20 have successively narrower widths W1, W2, W3 the deeper into N substrate 50. Also, vertical spacing G1, G2, G3 between P islands 44 increases with depth in N substrate 50. Spacing G1 between the uppermost P island 44 and P+ tap 36 is smaller than spacing G2 and G3.

For example, widths W1, W2, W3 could be 6 µm, 2 µm, and 1 µm, while G1, G2, G3 could be 2 µm, 3 µm, and 4 µm, respectively. The depth of trench 20 could be 3 µm and the polysilicon gate depth 1 µm, including N+ source 32 and P region 30.

Figure 7:
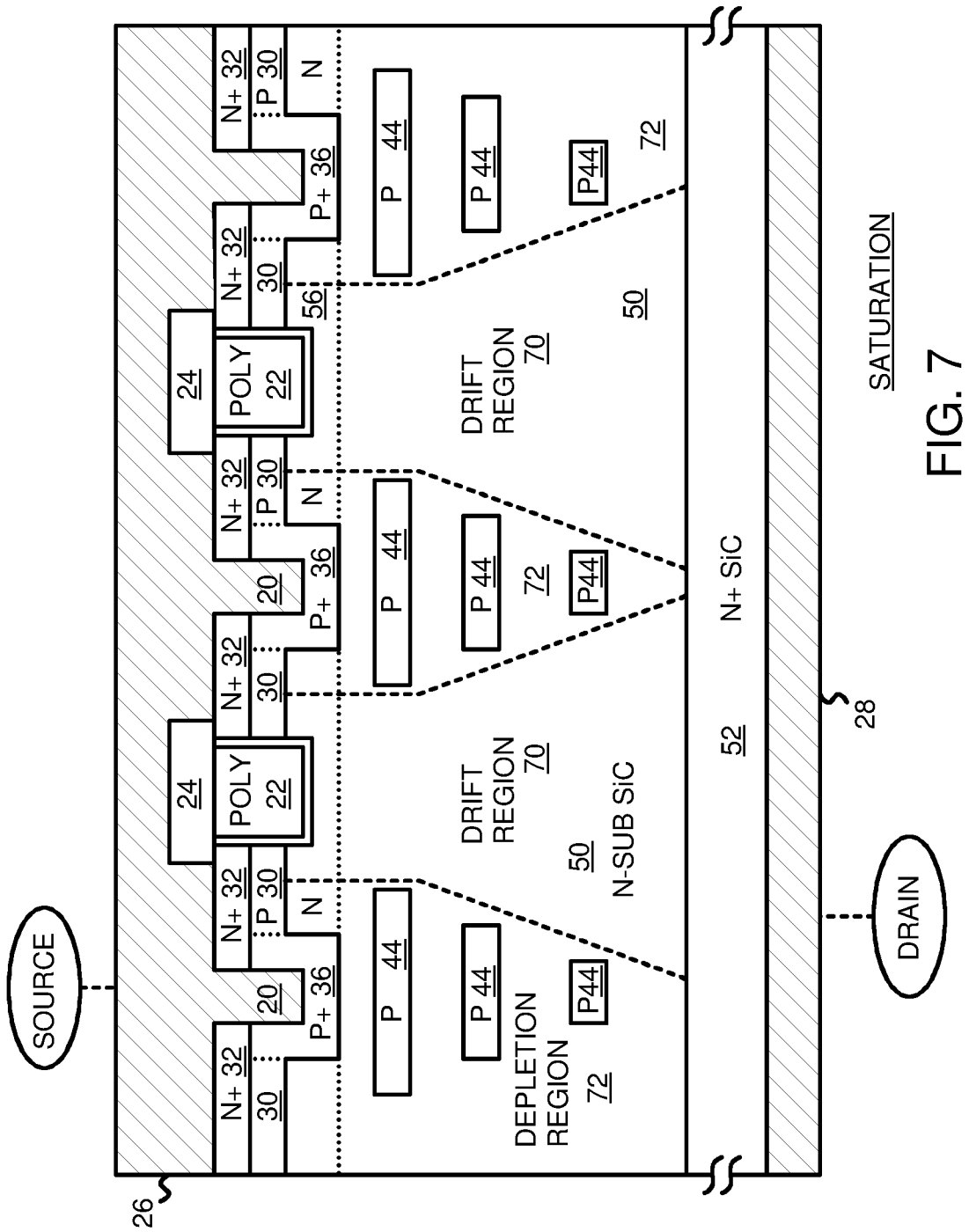
FIG. 7 highlights depletion and drift regions in saturation mode.

FIG. 7 highlights depletion and drift regions in saturation mode. Saturation mode occurs at high drain-source voltages. The JFET device has a reverse biased pn junction of P+ tap 36 and N substrate 50 that creates a depletion region that is depleted of carriers. Electrons in depletion region 72 are reduced in density by being pulled into P+ tap 36 by the electric field. Electrons deeper in N substrate 50 can be drawn into P islands 44 during depletion.

The shape of depletion region 72 is controlled by the taper of the widths of P islands 44 and the drain-source voltage. The electric field extends laterally to the sides of P islands 44 for a short distance, giving depletion region 72 a tapered shape. As the drain source voltage further increases, the deeper becomes depletion region 72 as it further depletes, and the tapered shape will tend to a more rectangle shape.

Drift region 70 is formed between depletion regions 72. Drift region 70 also has a tapered or conical shape, with narrowing near the top and widening near the bottom. Drift region 70 is not depleted of carriers but the relatively low doping of N substrate 50 limits current flow.

Figure 8:
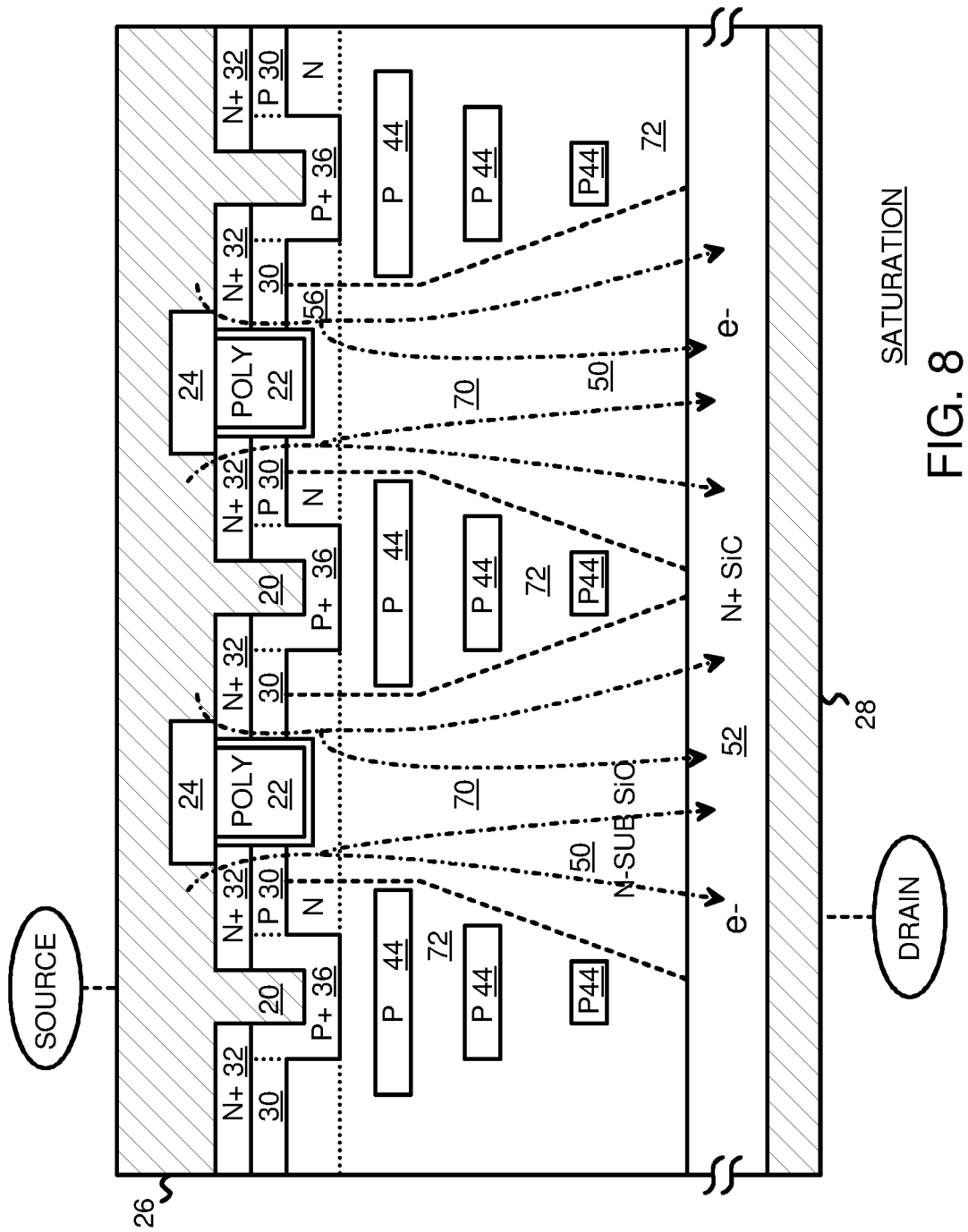
FIG. 8 highlights current flow in drift regions in saturation mode.

FIG. 8 highlights current flow in drift regions in saturation mode. Saturation mode occurs at high drain-source voltages. The JFET device has a reverse biased pn junction of P+ tap 36 and N substrate 50 that creates depletion region 72. The tapered shape of depletion region 72 is caused by the tapered widths of P islands 44. The JFET device effect pinches or reduces with width of drift region 70 between adjacent P+ taps 36 and P islands 44 at higher Vds voltages. This pinching of drift region 70 reduces the current as Vds increases to produce the JFET effect.

During saturation mode, the high Vds causes depletion region 72 to reach all the way down to N+ drain 52. Current from the MOSFET device of N+ source 32, P region 30, and N substrate 50 must flow through the drain's drift region 70 in N substrate 50 to reach N+ drain 52 and drain metal 28. Current crowding occurs near the top of drift region 70, where P islands 44 are the widest. There is less current crowding near the bottom of drift region 70, where P islands 44 are smaller. Thus current flows more easily and with less resistance at the bottom of drift region 70, while current flow is more restricted and has a higher resistance at the top of drift region 70, where P islands 44 are wide, pinching drift region 70. During higher drain-source voltages, the bottom of depletion region 72 further depletes and further increases the resistance at the bottom of drift region 70. Saturation current is thus limited by the JFET effect that pinches off the current corridor near the top of drift region 70.

Figure 9:
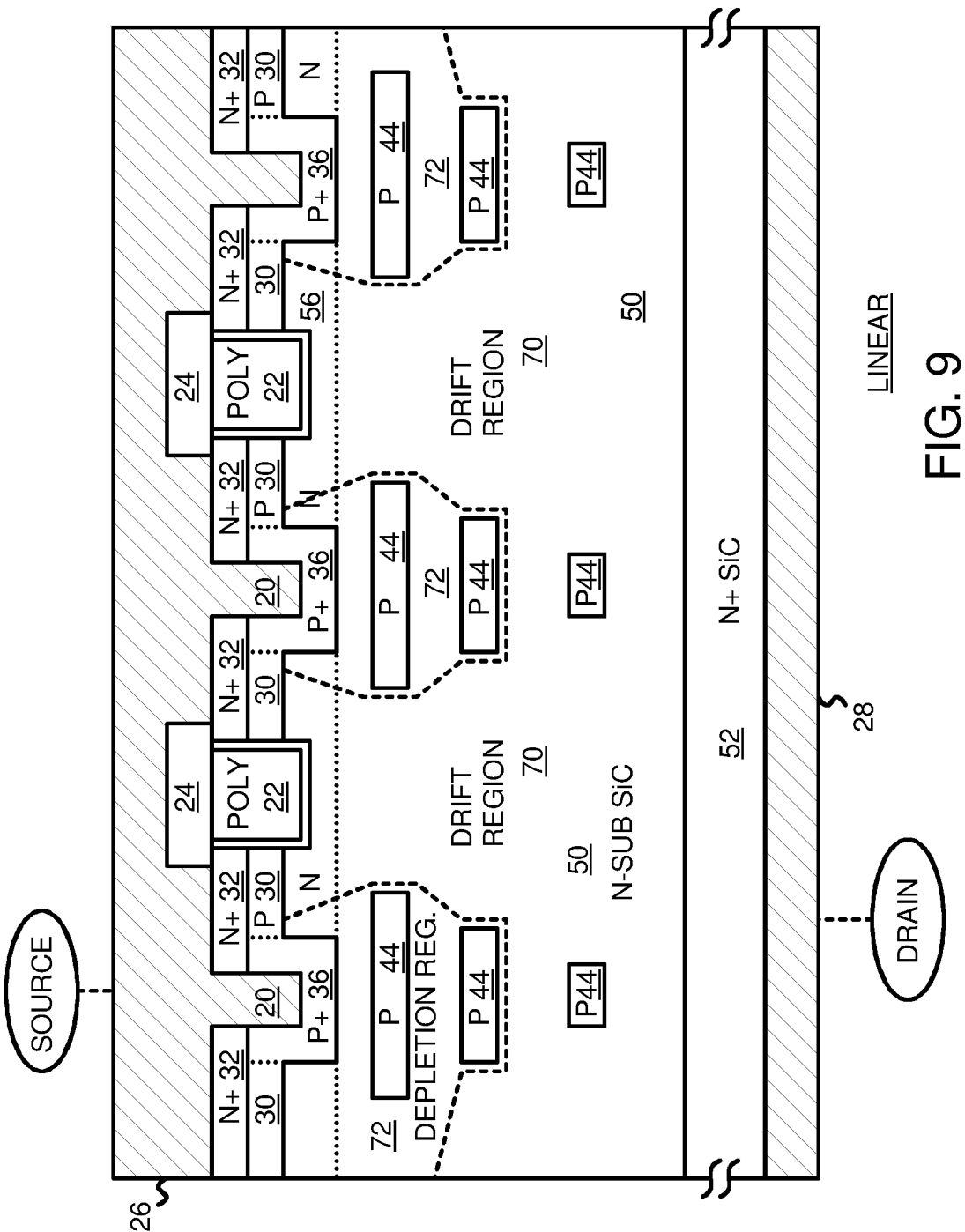
FIG. 9 highlights depletion and drift regions in linear mode.

FIG. 9 highlights depletion and drift regions in linear mode. Linear mode occurs at lower drain-source voltages than saturation mode. The JFET device has a reverse biased pn junction of P+ tap 36 and N substrate 50 that creates a depletion region that is depleted of carriers. Electrons in depletion region 72 are reduced in density by being pulled into P+ tap 36 by the electric field.

In contrast with saturation mode, in linear mode the voltage is not high enough for depletion region 72 to reach all the way down to N+ drain 52. Instead, depletion region 72 ends partway through N substrate 50. The depth of depletion region 72 varies with the drain voltage Vds during linear mode. As Vds increases, depletion region 72 moves deeper into N substrate 50. However, when depletion region 72 first touches the top of a new P island 44, that entire P island 44 becomes charged and depletion region 72 is extended around that P island 44. So P islands 44 cause depletion region 72 to jump to deeper depths as Vds increases. The shape and placement of P islands 44 can be used to control the shape of depletion region 72.

Figure 10:
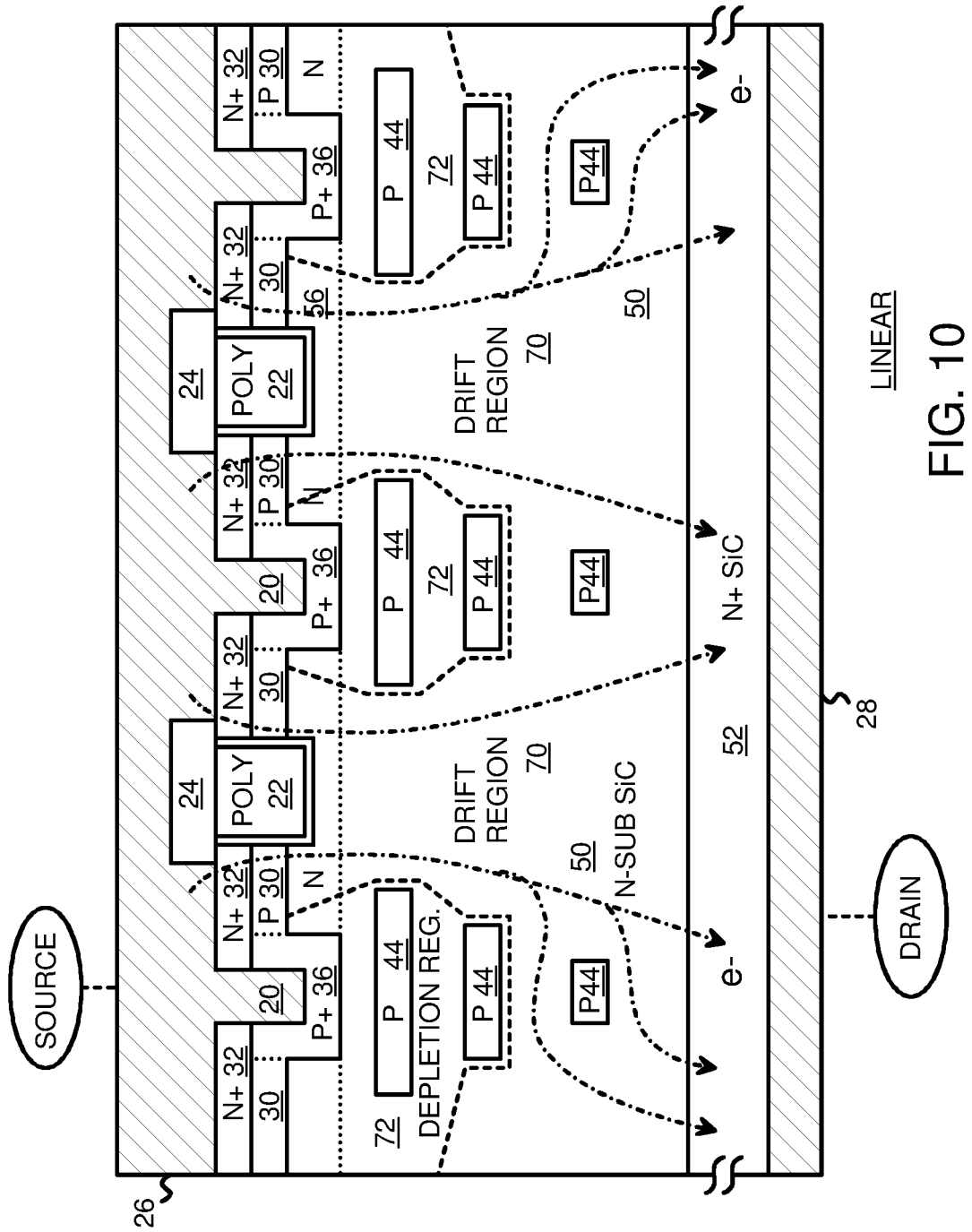
FIG. 10 highlights current flow in linear mode.

FIG. 10 highlights current flow in linear mode. The width of depletion region 72 at the top, between the uppermost P islands 44, is narrower in linear mode than in saturation mode since depletion region 72 extends a smaller distance sideways from P islands 44 with the lower Vds in linear region. This allows current to flow more easily and with a lower resistance.

Also, depletion region 72 does not reach all the way down to N+ drain 52, so drift region 70 extends underneath depletion region 72 in linear mode. Current can flow through drift region 70 sideways, around or between P islands 44 that are not part of depletion region 72. These additional current pathways reduce the ON resistance for linear mode.

The wider spacings between P islands 44 at greater depths provide wider lateral current paths than for the upper P islands 44. This causes a steepening of the Ids-Vds curve in the linear region. This steeper I-V curve means that the drain-source resistance is lower than it otherwise would be, due to the wider spacings of P islands 44 for deeper depths. Also the wider spacings of P islands 44 will further reduce Idsat in saturation mode.

Thus the integrated MOSFET-JFET device provides a lower ON resistance in the linear region, which improves device efficiency. Also, the saturated current is limited and thus reduced in the saturation region, providing better short-circuit protection. The geometry of P islands 44 can be adjusted, such as by using circuit simulations, to provide an optimal trade off. In particular, increasing the width of drift region 70 can increase current while narrowing the width of depletion region 72 can increase ON resistance, Rdson. P islands 44 allow the width of depletion region 72 to be varied for different depths and Vds, allowing both a lowering of saturation current and a lowering of linear-region Rdson. Thus tapered P islands 44 allow for a better trade-off of saturation current and Rdson than would be possible without tapered P islands 44.

Figure 11:
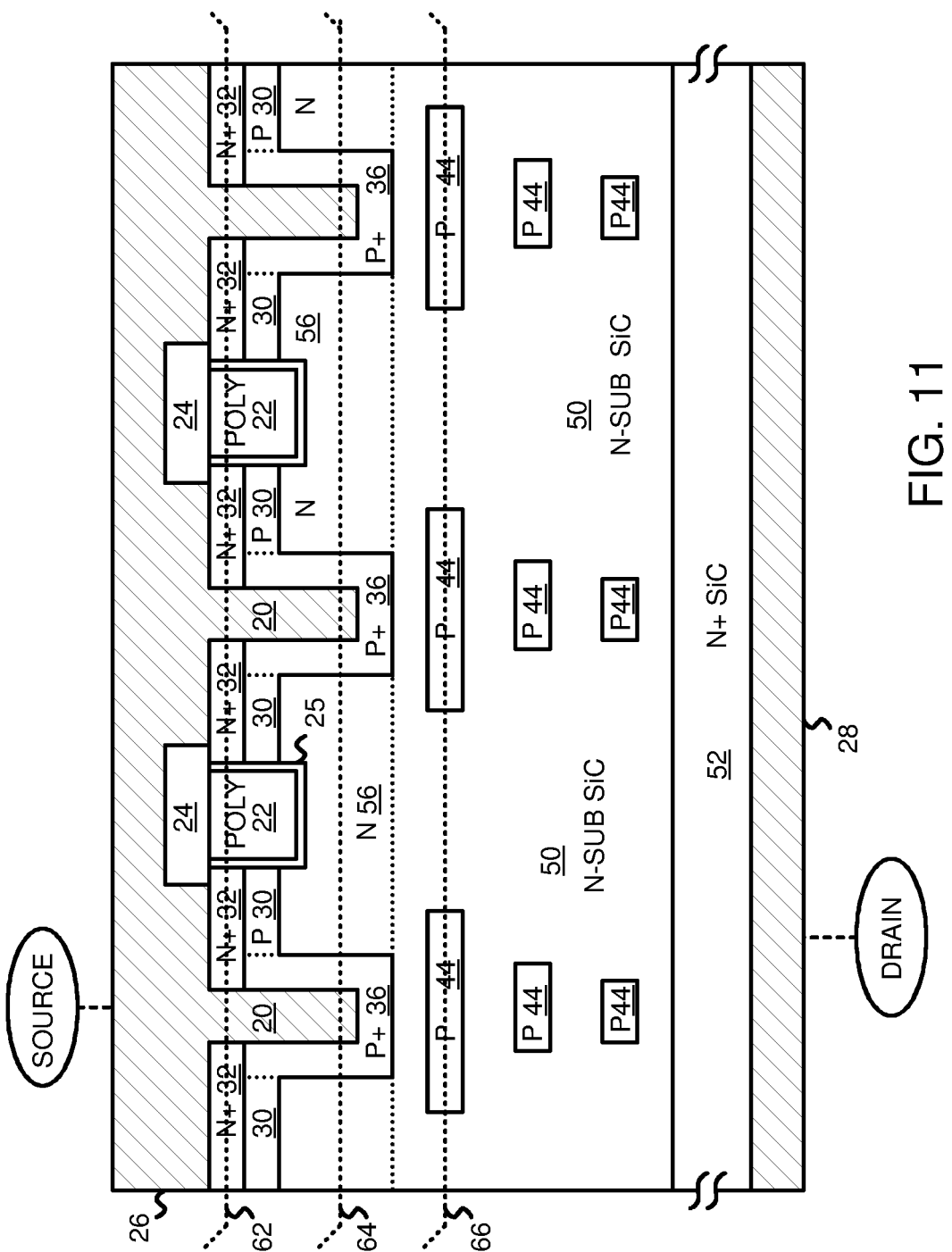
FIG. 11 locates the horizontal cross-sections of FIGS. 12-14.
Figure 12:
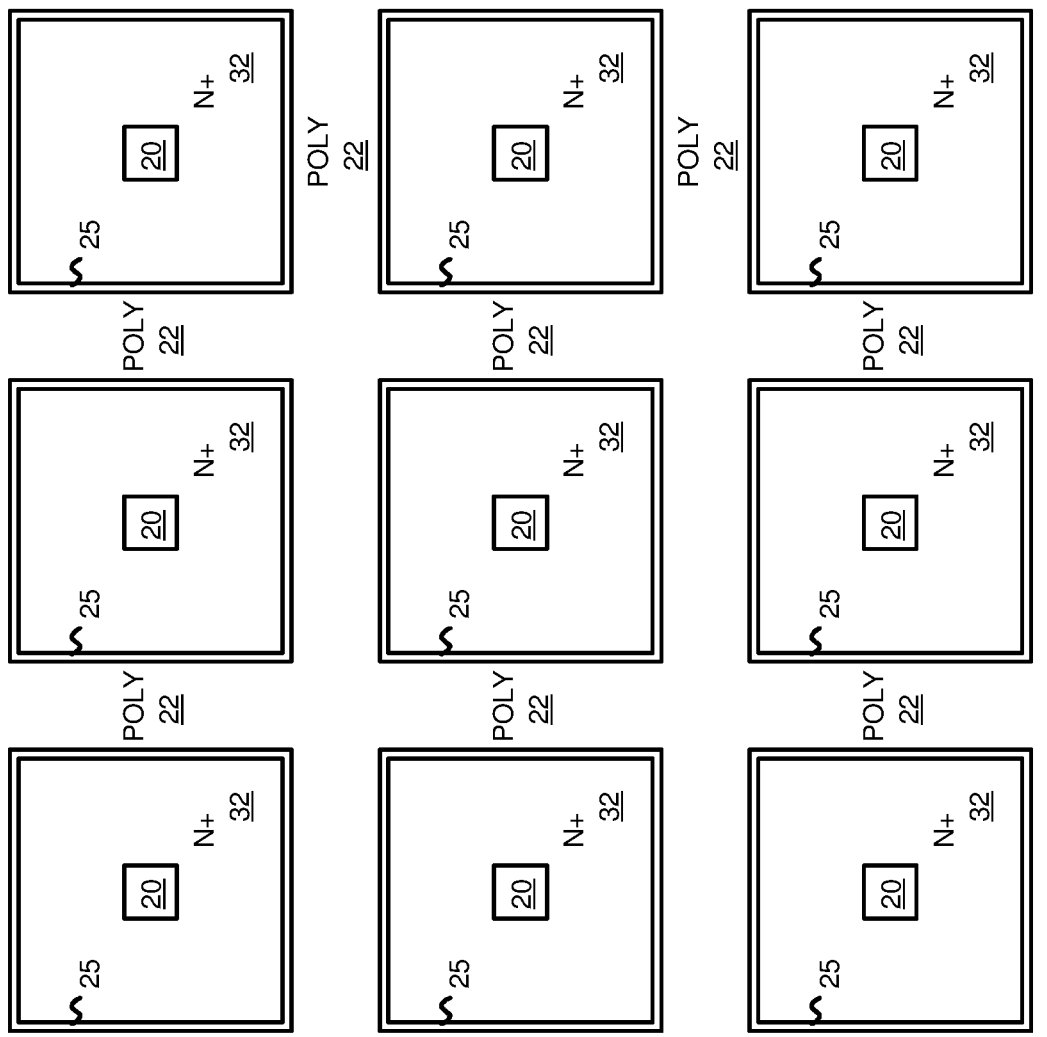
FIG. 12 is a horizontal section through the source of the SiC MOSFET.

FIG. 11 locates the horizontal cross-sections of FIGS. 12-14 on the vertical cross-sectional diagram. FIG. 11 is the same as FIG. 4 but has deeper trenches 20. Cross-section 62 is shown in FIG. 12 and passes through N+ source 32, source metal 26 on trench 20, gate oxide 25, and polysilicon gate 22. Cross-section 64 is shown in FIG. 13 and passes through upper N region 56, P+ tap 36, and source metal 26 in trench 20. Cross-section 66 is shown in FIG. 14 and passes through N substrate 50 and P islands 44.

FIG. 12 is a horizontal section through the source of the SiC MOSFET. FIG. 12 shows cross-section 62 shown in FIG. 11 that passes through N+ source 32, source metal 26 in trench 20, gate oxide 25, and polysilicon gate 22.

N+ source 32 can form a doughnut or ring around trench 20 that is filled with source metal 26. Gate oxide 25 separates N+ source 32 from polysilicon gate 22. Polysilicon gates 22 are connected together to form a grid surrounding the doughnuts of N+ source 32 around trench 20.

FIG. 13 is a horizontal section through the JFET. FIG. 13 shows cross-section 64 that passes through upper N region 56, P+ tap 36, and source metal 26 in trench 20. P+ tap 36 forms an array of doughnuts around trench 20. Outside these P+ tap 36 doughnuts is upper N region 56.

The centers of trench 20 and P+ tap 36 doughnuts can be aligned with the centers of P islands 44 that are below cross-section 64 and shown later in FIG. 14. This placement of P+ tap 36 helps direct JFET and MOSFET channel current injected into upper N region 56 to pass between adjacent pairs of P islands 44 and not near P islands 44 (not shown, but under trench 20). This alignment improves current spreading and reduces ON resistance.

FIG. 14 is a horizontal section through the P islands. FIG. 14 shows cross-section 66 that passes through N substrate 50 and P islands 44.

One center P island 44 is surrounded by 8 P islands 44. Current passes through the interface between P region 30 and gate oxide 25, and then flows into upper N region 56 and then passes through N substrate 50 between P islands 44 and the perimeter of the diagram, away from center P islands 44.

Alternate Embodiments

Several other embodiments are contemplated by the inventors. For example upper N region 56 provides a dual-doping profile for a dual-drift region. Drift region 70 include a higher doping upper N region 56, which has a lower resistance, and a lower drift region with a lower doping and higher resistance in N substrate 50. This dual-drift region using upper N region 56 can improve forward current and reduce Rdson.

While 3 P islands 44 under each trench 20 have been shown, there could be four P islands 44 under each trench 20, or some other number of P islands 44. Different tapers could be used, such as a linear reduction in width, or a non-linear reduction. The vertical spacing between P islands 44 could increase with greater depths in the substrate, or could be the same, or could decrease with greater depths. More complex vertical spacing profiles that both increase and decrease with depth, such as with two or more inflexion points, could be used, especially when the number of P islands 44 is 3 or more. The spacing and widths could be determined or adjusted from circuit simulation results. Width and spacing could have different tapers.

Different sizes, shapes, layouts, and profiles may be used. The thicknesses of various layers may be adjusted for the particular process used. Doping levels and dopant densities may vary. Various combinations of structures may be used. Trench 20 could be partially or fully filled in with source metal 26 or with some other material. The thickness of source metal 26 could be thicker and could fill trench 20, or could be very thin on the walls and bottom of trench 20.

P+ tap 36 could be a buried layer that contacts source metal 26 on the sidewalls of trench 20 and does not contact source metal 26 at the bottom of trench 20. P+ tap 36 does not have to touch N+ source 32 but could have another layer in-between. P+ tap 36 could be formed by doping the bottom and sidewalls of trench 20.

The transistor threshold voltage VTH can be greater than zero for an enhancement device, or can be less than zero for a depletion device. The doping levels of P region 30 and N substrate 50 or upper N region 56 can be adjusted to adjust the threshold.

As one example of doping levels, N substrate 50 can be $10^{14}$ to $10^{18}$, P region 30 can be $10^{14}$ to $10^{18}$, and P+ islands 44, P+ tap 36, N+ source 32, and N+ drain 52 can be $10^{17}$ to $10^{21}$. Upper N region 56 can be $10^{15}$ to $10^{19}$.

The center of P region 30 and trench 20 may align with the center of P islands 44 as shown in the figures, or may have other alignments. The transition of P+ tap 36 to P region 30 may be shifted right or left. P region 30 could be deeper or thicker than P+ tap 36 or shallower than P+ tap 36, as long as P region 30 contacts P+ tap 36. Additional areas may have a thicker field oxide underneath polysilicon gate 22 and contacts to metal layers may be made to polysilicon gate 22 over these field oxide areas, or directly over gate oxide 25 in some processes.

Charge balancing is improved when the overall positive and negative charges are balanced, which occurs when the integrated doping level of N substrate 50 is about the same as the integrated doping levels of P islands 44, integrated over the length of the islands.

P islands 44 could be arranged in the $(8+1)^N$ pattern as shown in FIG. 14 where one center P island 44 is surrounded by 8 P islands 44, or in other patterns such as $(3+1)^N$, $(4+1)^N$, ... $(M+1)^N$ patterns. N represents the repeating number of cells of the device in 2 dimensions. The number N may be large for a real device, such as >100. P islands 44 could be centered over the center of trench 20, or could be off-center, and could be symmetric or asymmetric.

Many variations of IC semiconductor manufacturing processes are possible. Photomasks may be made with a variety of specialty machines and processes, including direct writing to burn off a metalized layer rather than a photoresist. Many combinations of diffusions, oxide growth, etching, deposition, ion implant, and other manufacturing steps may have their resulting patterns created on the IC controlled by the photomasks. While circuit simulation or modeling transistors has been described, and modeling drain current in particular, other currents such as diode currents, substrate leakage currents, etc., could be modeled, and for other devices such as capacitors, resistors, etc.

Some of the etching steps can be dry trench etching to obtain sharper edges. Variations in the sequence of the process steps and in the process steps themselves may be performed. Additional process steps may be added, such as for cleaning or for additional metal layers or for other transistor types such as standard complementary metal-oxide-semiconductor (CMOS) transistors when the power transistors are integrated onto a larger device.

Polysilicon gate 22 could be covered on top by a dielectric that could be covered by a metal such as tungsten, to provide better adherence for source metal 26 while insulating polysilicon gate 22. Other composite layers may be used.

While trench 20 has been shown as being deeper than the MOSFET, the trench could be shallower and upper N region 56 could be deeper. The exact placement of P region 30 in the channel could be adjusted.

P+ or N+ taps could be added and could be merged together into a strip or even a ring. P+ taps could surround integrated MOSFET-JFET device 100 on all 4 sides or only on one side. The devices could be arrayed or replicated, such as by repeating the MOSFET or JFET structures.

The device could be simplified by deleting upper N region 56 and replacing it with N substrate 50. upper N region 56 could be considered to be a more highly doped part of N substrate 50. The device could be further simplified by having only one polysilicon gate 22 and two trenches 20. Trench 20 could form a ring around polysilicon gate 22.

The spacing between regions and their thicknesses could vary and depend on process design rules, and may be adjusted for desired characteristics of integrated MOSFET-JFET device 100. Different horizontal widths of diffusion regions such as N+ source 32 may be used. Different channel lengths of the gates may be used to adjust threshold voltage and DC leakage. Various parasitic capacitances may be present. The layout and geometry of integrated MOSFET-JFET device 100 can affect its performance.

Terms such as up, down, above, under, horizontal, vertical, inside, outside, are relative and depend on the viewpoint and are not meant to limit the invention to a particular perspective. Devices may be rotated so that vertical is horizontal and horizontal is vertical, so these terms are viewer dependent. As long as the two directions are substantially perpendicular to each other, one line or direction can be considered to be vertical and the other considered to be horizontal.

Polysilicon gates 22 have been shown as small rectangles, but can have various shapes, and may connect to each other either on the gate or polysilicon layer or through contacts to metal layers. Polysilicon gate 22 may connect to control signals through these contacts to metal that are not shown in the drawings. Polysilicon gate 22 could also be floating, or could be capacitively coupled to control or supply nodes. Polysilicon gate 22 could be standard polysilicon, or various other gate materials. Gate oxide 25 underneath polysilicon gate 22 can be a gate oxide, or can be a thicker field or isolation oxide, or can be combinations of both, such as a thick oxide underneath polysilicon gate 22, but a thin gate oxide on the sidewalls near the P, N source, channel, drain regions.

Various materials may be used. Although the dopant concentration tends to vary within a region, the dopant concentration may still be considered to be relatively constant when compared with the rapid change in dopant concentration near region boundaries.

The substrate, N substrate 50, is substantially planar although there may be variations of its upper surface due to features being etched into the top surface. The MOSFET structure is substantially perpendicular to the planar surface of the substrate. The sidewalls of polysilicon gate 22 can be sloped somewhat, perhaps being within 20 degrees of perpendicular to the substrate's generally planar surface. The centerline between the two sidewalls of polysilicon gate 22 can be nearly perpendicular, with no more than 20 degrees from being perpendicular to the plane of the substrate.

The semiconductor process used to manufacture integrated MOSFET-JFET device 100 may have several variations. The alternatives may be combined in various ways, or used separately or in other combinations.

While N substrate 50 has been described, a P substrate could be substituted with a deep N-well in the p-type substrate, or a dual-well or multi-well process. All P and N types could be swapped for using a P substrate rather than N substrate 50. Various alternate transistor technologies such as Bipolar or BiCMOS could be added.

While descriptions of current flows and operations have been presented, these are theoretical and the theories may be incomplete or even incorrect. Especially for small devices, currents may flow in unusual ways and using mechanisms that have not yet been thoroughly researched and understood.

The currents themselves may spread out or crowd together at various locations, and thus the current may not flow in a straight line, or part of a current may flow in a straight line, but edges of the current flow may bend or curve around obstacles such as diffusion region edges. Thus current flow directions are simplified and averaged and can ignore endpoint connections such as contacts to external metal lines, and fringe and boundary effects.

Cutouts in diffusion and other regions may be used. Other shapes and physical layouts may be substituted, such as intermingled fingers. Regions could be merged together, such as by forming a ring or doughnut shape when the layout is viewed from above.

Devices may be implemented using n-channel, p-channel, or bipolar transistors, or junctions within these transistors. The gate lengths can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added.

The final profiles and shapes of various layers may differ depending on the process used. In particular, deeper layers may shift around relative to the mask layouts. Also, the mask edges and final processed boundaries may differ with process steps.

The shape of integrated MOSFET-JFET device 100 may differ, such as by having a more rounded bottom or field-oxide boundaries.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An integrated Metal-Oxide-Semiconductor Field-Effect Transistor (MOSFET)-Junction Field-Effect Transistor (JFET) device comprising:
    a drain contact formed on a backside of a highly-doped semiconductor substrate having a first dopant type with a high concentration;
    a substrate formed on a frontside of the highly-doped semiconductor substrate, the substrate having a low concentration of the first dopant type;
    buried islands formed within the substrate and above the highly-doped semiconductor substrate, the buried islands having a second dopant type with an opposite polarity as the first dopant type, the buried islands separated from a top surface by the substrate and separated from the backside by the substrate;
    a trench formed from the top surface into the substrate, the trench having sidewalls and a bottom that are doped with the second dopant type to form a JFET tap that contacts the substrate;
    wherein the trench is formed above one of the buried islands, wherein a JFET is formed by the JFET tap and the substrate;
    wherein the buried islands are all within a depletion region created during a saturation mode, and wherein a lower buried island in the buried islands is not within the depletion region during the linear mode;
    a polysilicon gate formed between the trench and another trench;
    a source formed on the top surface next to the polysilicon gate, the source having a high concentration of the first dopant type;
    a body region formed underneath the source next to the polysilicon gate, the body region connecting to the JFET tap;
    wherein the body region forms a channel of a MOSFET when biased by the polysilicon gate, the channel for conducting current between the source and the substrate;
    wherein the body region has a low concentration of the second dopant type, wherein the low concentration is lower than the high concentration by at least one order of magnitude; and
    a gate oxide isolating the polysilicon gate from the source, the body region, and the substrate;
    wherein the buried islands further comprise:
    an uppermost buried island that is separated from the JFET tap by a first separation distance and having a first width;
    a middle buried island that is separated from the uppermost buried island by a second separation distance and having a second width;

a lower buried island that is separated from the middle buried island by a third separation distance and having third width;

wherein the first width is wider than the second width, and the second width is wider than the third width;

wherein the uppermost buried island, the middle buried island, and the lower buried island form a tapered structure;

wherein the separation distance is smaller than the second separation distance, and the second separation distance is smaller than the third separation distance;

wherein vertical spacing between the buried islands increases for deeper buried islands deeper in the substrate;

wherein ON resistance through a drift region in the substrate is reduced during the linear mode by increased vertical separation between buried islands deep in the substrate.

2. The integrated MOSFET-JFET device of claim 1 further comprising:

source metal above the top surface for connecting to a first terminal;

the source metal forming a contact from the source metal to the source;

the source metal forming a contact from the source metal to the JFET tap;

backside metal forming the drain contact, wherein the backside metal is for connecting to a second terminal.

3. The integrated MOSFET-JFET device of claim 2 wherein the MOSFET is a vertical device having current flowing through the channel formed in the body region that is substantially orthogonal to a plane of the highly-doped semiconductor substrate.

4. The integrated MOSFET-JFET device of claim 3 wherein the JFET tap has a higher concentration of the second dopant type than does the body region;

wherein the substrate further comprises an upper drain region, formed at a top of the substrate adjacent to the polysilicon gate and underneath the body region;

wherein the upper drain region has a higher concentration of the first dopant type than the low concentration of the first dopant type in the substrate;

wherein the upper drain region and the substrate form a dual-drift region having a reduced ON resistance.

5. The integrated MOSFET-JFET device of claim 1 wherein the uppermost buried island, the middle buried island, and the lower buried island are each vertically aligned with a center of the trench.

6. The integrated MOSFET-JFET device of claim 1 wherein the substrate, buried islands, and highly-doped semiconductor substrate are formed of Silicon-Carbide (SiC).

7. The integrated MOSFET-JFET device of claim 6 wherein the body region has a low concentration of the second dopant type and the substrate has a low concentration of the first dopant type;

wherein a transistor electron current through the MOSFET flows from the source metal to the source, through the channel formed in the body region, through the substrate and between the buried islands to the highly-doped semiconductor substrate to the drain contact;

wherein the transistor electron current is modulated by a gate voltage applied to the polysilicon gate, the gate voltage being independently controlled from a drain-to-source voltage applied between the source metal and the drain contact;

wherein transistor electron current through the MOSFET is further modulated by the JFET that increases the depletion region between the buried islands in response to higher drain-to-source voltages, wherein increases in the depletion region reduce a drift region in the substrate that the transistor electron current through the MOSFET flows through.

8. The integrated MOSFET-JFET device of claim 7 wherein the first dopant type is n-type, and the second dopant type is p-type.

9. An integrated device comprising:

a semiconductor substrate forming an N+ drain;

drain metal formed on a back surface of the semiconductor substrate to contact the N+ drain;

an N substrate formed over the semiconductor substrate opposite the back surface;

a trench formed into the N substrate on a top surface opposite the back surface;

a P+ tap formed on sides and on a bottom of the trench;

an N+ source formed on the top surface;

a P body diode formed between the N+ source and the N substrate and in contact with the P+ tap;

a gate;

a gate oxide that separates the gate from the N+ source, the P body diode, and the N substrate;

a channel layer formed in the P body diode next to the gate oxide in response to a bias voltage applied to the gate, the channel layer conducting between the N+ source and the N substrate;

source metal formed above the top surface, the source metal making contact with the N+ source and with the P+ tap;

a first buried P island formed within the N substrate and surrounded by the N substrate, the first buried P island situated under the trench and separated from the P+ tap by a first vertical spacing of the N substrate, the first buried P island having a first width;

a second buried P island formed within the N substrate and surrounded by the N substrate, the second buried P island situated under the trench and separated from the first buried P island by a second vertical spacing of the N substrate, the second buried P island having a second width;

a third buried P island formed within the N substrate and surrounded by the N substrate, the third buried P island situated under the trench and separated from the second buried P island by a third vertical spacing of the N substrate, the third buried P island having a third width;

wherein the third vertical spacing is larger than the second vertical spacing;

wherein the second vertical spacing is larger than the first vertical spacing, wherein buried P islands have increasing vertical spacings as depth within the N substrate increases.

10. The integrated device of claim 9 wherein the first width is greater than the second width;

wherein the second width is greater than the third width;

wherein buried P islands have decreasing widths as depth within the N substrate increases.

11. The integrated device of claim 9 wherein the N substrate, the first, second, and third buried P island, the P body diode, the P+ tap, and the N+ source are formed by layers of Silicon-Carbide (SiC) over the semiconductor substrate which is Silicon-Carbide (SiC).

12. The integrated device of claim 11 wherein the P body diode has a low doping concentration that is lower than a doping concentration of the N+ source.

13. A tapered depletion region device comprising:
  a highly-doped semiconductor substrate having a first dopant type with a high concentration;
  a drain contact formed on a backside of the highly-doped semiconductor substrate;
  a substrate formed on a frontside of the highly-doped semiconductor substrate, the substrate having a low concentration of the first dopant type;
  a plurality of trenches, each trench in the plurality of trenches having sidewalls and a bottom that are doped with a second dopant type to form a Junction Field-Effect Transistor (JFET) tap that contacts the substrate;
  a plurality of columns of buried islands, each column of buried islands located under a trench in the plurality of trenches, each column of buried islands comprising:
  a first buried island formed within the substrate and surrounded by the substrate, the first buried island located under the trench and separated from the JFET tap by a first vertical spacing of the substrate, the first buried island having a first width;
  a second buried island formed within the substrate and surrounded by the substrate, the second buried island located under the trench and separated from the first buried island by a second vertical spacing of the substrate, the second buried island having a second width;
  a third buried island formed within the substrate and surrounded by the substrate, the third buried island located under the trench and separated from the second buried island by a third vertical spacing of the substrate, the third buried island having a third width;
  wherein the first width is greater than the second width;
  wherein the second width is greater than the third width;
  wherein buried islands have decreasing widths as depth within the substrate increases;
  wherein the third vertical spacing is larger than the second vertical spacing;
  wherein the second vertical spacing is larger than the first vertical spacing,
  wherein buried islands have increasing vertical spacings as depth within the substrate increases,
  a plurality of Metal-Oxide-Semiconductor Field-Effect Transistors (MOSFETs), each MOSFET in the plurality of MOSFETs comprising:
  a polysilicon gate formed between trenches in the plurality of trenches;
  a source formed on a top surface next to the polysilicon gate, the source having a high concentration of the first dopant type;
  a body region formed underneath the source next to the polysilicon gate, the body region connecting to the JFET tap;
  wherein the body region forms a channel of the MOSFET when biased by the polysilicon gate, the channel for conducting current between the source and the substrate;
  wherein the body region has a low concentration of the second dopant type, wherein the low concentration is lower than the high concentration by at least one order of magnitude; and
  a gate oxide isolating the polysilicon gate from the source, the body region, and the substrate.

14. The tapered depletion region device of claim 13 further comprising:
  source metal above the top surface for connecting to a first terminal;
  a contact from the source metal to the source;
  a contact from the source metal to the JFET tap;
  backside metal forming the drain contact, wherein the backside metal is for connecting to a second terminal.

15. The tapered depletion region device of claim 13 wherein the MOSFET is a vertical device having current flowing through the channel formed in the body region that is substantially orthogonal to a plane of the highly-doped semiconductor substrate;
  wherein the buried islands are all within a depletion region created by the JFET within the substrate during a saturation mode, and wherein upper buried islands are within the depletion region during a linear mode, wherein the upper buried islands are above lower buried islands that are not within the depletion region during the linear mode.

* * * * *